(12) United States Patent
Kinoshita et al.

(10) Patent No.: US 6,597,574 B2
(45) Date of Patent: Jul. 22, 2003

(54) RADIATOR PLATE AND PROCESS FOR MANUFACTURING THE SAME

(75) Inventors: Kyoichi Kinoshita, Kariya (JP); Katsufumi Tanaka, Kariya (JP); Eiji Kono, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/038,265

(22) Filed: Oct. 24, 2001

(65) Prior Publication Data

US 2002/0063499 A1 May 30, 2002

(30) Foreign Application Priority Data

Oct. 25, 2000 (JP) ........................................ 2000-325799

(51) Int. Cl.[7] ................................................. H05K 7/20
(52) U.S. Cl. ........................ 361/704; 361/705; 361/706; 361/707; 361/708; 361/709; 361/710; 29/890.03
(58) Field of Search ................................. 361/704, 705, 361/707, 708, 709, 710; 257/706, 712, 717, 617; 428/610, 614, 620

(56) References Cited

U.S. PATENT DOCUMENTS

| | | | | | |
|---|---|---|---|---|---|
| 5,020,583 A | * | 6/1991 | Aghajanian et al. | ..... | 164/122.1 |
| 5,981,085 A | * | 11/1999 | Ninomiya et al. | .......... | 257/712 |
| 6,037,066 A | * | 3/2000 | Kuwabara | ................... | 257/675 |
| 6,245,442 B1 | * | 6/2001 | Towata et al. | ............... | 257/707 |
| 6,250,127 B1 | * | 6/2001 | Polese et al. | ................. | 72/256 |
| 6,284,389 B1 | * | 9/2001 | Jones et al. | ................ | 148/516 |
| 6,340,796 B1 | * | 1/2002 | Smith et al. | ................ | 174/255 |
| 6,355,362 B1 | * | 3/2002 | Jones et al. | ................. | 257/720 |

FOREIGN PATENT DOCUMENTS

JP  11-126870  5/1999  ........... H01L/25/07

* cited by examiner

*Primary Examiner*—Boris Chervinsky
(74) *Attorney, Agent, or Firm*—Morgan & Finnegan, LLP

(57) ABSTRACT

A radiator plate includes a metallic matrix and a dispersant. The metallic matrix exhibits a predetermined coefficient of thermal expansion. The dispersant is dispersed in the metallic matrix, and exhibits a coefficient of thermal expansion being smaller than that of the metallic matrix. The radiator plate has a heat-receiving surface, on which an electric device serving as a heat generator is disposed, and a heat-radiating surface for radiating heat received from the heat-receiving surface. The dispersant is dispersed more on the heat-receiving-surface side than on the heat-radiating-surface side. Thus, the radiator plate is inhibited from warping, and is good in terms of the dimensional stability as a final product. Moreover, the thermal resistance is diminished between the heat-receiving surface and the heat-radiating surface. Accordingly, the heat-radiating ability of the radiator plate is secured. Also disclosed is a process for manufacturing the radiator plate.

7 Claims, 1 Drawing Sheet

RADIATOR PLATE AND PROCESS FOR MANUFACTURING THE SAME

BACKGROUND OF THE INVENTION

1. Field of the Invention

The present invention relates to a heat radiator, which is used to radiate heat being emitted from a power module, and the like, and a process for manufacturing the same. The power module is, for example, constituted by an electric element (or electric device), which serves as a heat generator.

2. Description of the Related Art

A chip (e.g., silicon chip, etc.), a power module, or the like, is essential to control a variety of apparatuses. In the chip, there are disposed electric elements with a high density on a semiconductor substrate. In a power module, there are disposed a large number of chips.

However, semiconductor products should usually be used in determined service temperature ranges. When they are used outside the ranges, they cause malfunctions. Accordingly, it is necessary to appropriately radiate heat, which is emitted from silicon chips, and so on. In particular, the higher the integration degree of chips is, or the more the control electric current enlarges, the more it is necessary to enhance the cooling ability for chips.

Hence, it has been carried out conventionally to dispose a radiator plate on the lower surface of silicon chips, etc. For example, in Japanese Unexamined Patent Publication (KOKAI) No. 11-126,870, there is disclosed a radiator plate, which comprises a metal-based composite material using a ceramics dispersant. Specifically speaking, the radiator plate comprises a metal-based composite material, in which a silicon carbide powder, serving as a ceramics dispersant, is dispersed in an aluminum alloy, serving as a matrix. The aluminum alloy, which exhibits a good heat transfer coefficient, is used as a matrix to secure a heat-radiating ability. The silicon carbide, which exhibits a small thermal expansion coefficient, is dispersed in the aluminum alloy to inhibit the radiator plate from warping. Note that fins are disposed on the heat-radiating-surface side of the radiator plate, and that they are manufactured by using a core, which is made from a readily-soluble salt (e.g., NaCl).

However, the radiator plate, set forth in the aforementioned publication, is formed as a uniform organizational (or compositional) construction as a whole from the heat-receiving surface, on which silicon chips, or the like, exist, to the heat-radiating surface, on which the fins exist. Consequently, because of the temperature gradient, which arises from the heat-receiving surface to the heat-radiating surface, a gradient also takes place in the thermal expansion of the radiator plate. Namely, the thermal expansion is large on the heat-receiving-surface side, and it is small on the heat-radiating-surface side. Thus, warpage takes place in the entire radiator plate. Therefore, on the heat-receiving-surface side of the radiator plate, there might arise the fears of coming-off of the silicon chips, etc., therefrom, the degradation of contacting ability and the deterioration of heat-radiating ability.

Further, since the silicon carbide is dispersed uniformly in the entire radiator plate, the thermal resistance enlarges to lower the heat transfer coefficient. Thus, the heat-radiating ability might be impaired.

Furthermore, the conventional radiator plate is manufactured by using the salt core. Note that, however, the salt core exhibits a thermal expansion coefficient of about $46 \times 10^{-6}$/K and the metal-based composite material exhibits a thermal expansion coefficient of about $8 \times 10^{-6}$/K. Accordingly, there might arise a large thermal expansion difference between them before and after the molten metal is solidified. Consequently, warpage might take place in the resulting radiator plate after the casting. Hence, the dimensions of the final product might not be stabilized.

Moreover, the salt core is manufactured for each of the radiator plates. In addition, it is necessary to wash away the salt core with water after casting the radiator plate. Hence, it is not possible to say that the manufacturing process, set forth in the aforementioned publication, is a preferable manufacturing process in terms of the man-hour requirement as well as the cost.

SUMMARY OF THE INVENTION

The present invention has been developed in view of these circumstances. It is therefore an object of the present invention to provide a radiator plate, which is good in terms of the heat-radiating ability, and which can inhibit the warpage adequately.

Moreover, it is another object of the present invention to provide a process for manufacturing such a radiator plate efficiently.

The inventors of the present invention researched earnestly to solve the problems, made trial and error to achieve the objects, and carried out a variety of systematic experiments repeatedly. As a result, they thought of dispersing a dispersant more on a heat-receiving-surface side of a radiator plate than on a heat-radiating-surface side thereof. Thus, they have completed the development of a radiator plate according to the present invention. At the same time, they have completed the development of a suitable process for manufacturing the present radiator plate.

RADIATOR PLATE

A radiator plate according to the present invention can carry out the aforementioned object, and is characterized in that it comprises a metallic matrix exhibiting a predetermined coefficient of thermal expansion, and a dispersant being dispersed in the metallic matrix and exhibiting a coefficient of thermal expansion being smaller than that of the metallic matrix; that the radiator plate has a heat-receiving surface, on which an electric device serving as a heat generator is disposed, and a heat-radiating surface for radiating heat received from the heat-receiving surface; and that the dispersant is dispersed more on a side of the heat-receiving surface than on a side of the heat-radiating surface.

Since the dispersant of smaller thermal expansion coefficient is dispersed more on the side of the heat-receiving surface, in which an electric device serving as a heat generator is disposed, the thermal expansion is controlled on the heat-receiving-surface side. Accordingly, it is possible to secure the bonding ability or adhesion ability with respect to silicon chips, etc. Moreover, even when there arises a temperature gradient from the heat-receiving-surface side to the heat-radiating-surface side, it is possible to control or inhibit the warpage of the entire radiator plate because the dispersant of smaller thermal expansion coefficient is distributed more on the heat-receiving-surface side.

Moreover, contrary to a case where a member of small thermal coefficient is cast into a metal, in the heat radiator plate according to the present invention, it is possible to make the thermal resistance less and to inhibit a boundary layer from forming abruptly, because the dispersant of small thermal expansion coefficient is suitably distributed gradiently.

In particular, it is appropriate that, in the radiator plate according to the present invention, the metallic matrix can comprise aluminum as a major component and the dispersant can comprise a primary crystal including silicon as a major component.

The primary crystal (i.e., dispersant) comprising silicon as a major component exhibits a thermal expansion coefficient, which is in the proximity of a thermal expansion coefficient exhibited by a substrate made from silicon. Consequently, the thermal expansion difference can be furthermore diminished between the dispersant and the substrate. In addition, it is possible to readily produce the primary crystal comprising silicon as a major component, not by separately adding the dispersant to a molten alloy, but by controlling a solidifying temperature of the molten alloy. In addition, when the metallic matrix comprises aluminum as a major component, it is possible to obtain a radiator plate, which is good in terms of the thermal transfer ability and heat-radiating ability.

PROCESS FOR MANUFACTURING RADIATOR PLATE

A process for producing a radiator plate according to the present invention can carry out the aforementioned object, and is characterized in that it comprises the steps of: pressurizing and charging a hypereutectic molten alloy into a cavity of a mold with a filtering member disposed therein, the filtering member having opposite sides, from one of the opposite sides of the filtering member at a temperature of generating a primary crystal or less; and solidifying the resulting molten alloy after accumulating the primary crystal, being generated in the pressurizing-and-charging step, on the one of the opposite sides of the filtering member.

By maintaining the hypereutectic molten alloy at an appropriate temperature, the hypereutectic component arises as a primary crystal. Then, the primary crystal, which arises in the cavity of the mold, is filtered out by the filtering member in the pressurizing-and-charging step, and is accumulated on the one of the opposite sides of the filtering member. Under the circumstance, when the resulting molten alloy is cooled by cooling the mold or by the other methods (i.e., the solidifying step), it is possible to obtain a radiator plate, in which the primary crystal is accumulated on the one of the opposite sides of the filtering member.

Moreover, it is appropriate that the hypereutectic molten alloy can be an aluminum-silicon molten alloy whose hypereutectic component is silicon.

Thus, it is possible to efficiently manufacture the aforementioned radiator plate. Note that the resulting radiator plate is constituted by the metallic matrix, which comprises aluminum as a major component, and the dispersant, which comprises a primary crystal including silicon as a major component.

In addition, in a case where the hypereutectic molten alloy is pressurized and charged from the heat-radiating-surface side with respect to the filtering member (see FIG. 1.), it is appropriate that the present production process can further comprise the step of removing the filtering member after the solidifying step.

Note that the filtering member, which comprises a formed substance, or the like, made, for example, from ceramic fibers, can remain on the resultant heat radiator plate. However, when the filtering member is removed, it is possible to obtain the heat radiator plate, which warps less, and which is good in terms of the heat-radiating ability.

In accordance with the radiator plate according to the present invention, since the dispersant of small thermal expansion coefficient is present more on the heat-receiving-surface side, it is possible to diminish the thermal resistance between the heat-receiving surface and the heat-radiating surface. Accordingly, it is possible for the present radiator plate to secure the heat-radiating ability. Moreover, the present radiator plate is inhibited from warping, and is good in terms of the dimensional stability as a final product.

In accordance with the process for manufacturing a radiator plate, it is possible to manufacture such a good radiator plate not only with a good productivity but also at a less expensive cost.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
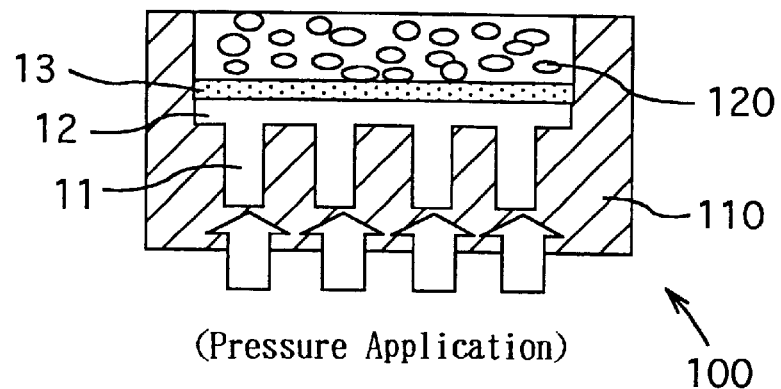
FIG. 1 is a schematic diagram for illustrating a process for manufacturing a radiator plate, an example according to the present invention.

Having generally described the present invention, a further understanding can be obtained by reference to the specific preferred embodiments which are provided herein for the purpose of illustration only and not intended to limit the scope of the appended claims.

The present invention will be hereinafter described in detail with reference to specific examples of the radiator plate and manufacturing process according to the present invention.

(1) Metallic Matrix

In addition to aluminum, the metallic matrix can be pure metals and a variety of alloys thereof. For example, the pure metals can be magnesium, copper, zinc, and the like.

(2) Dispersant

The dispersant can be such a material that can control the thermal expansion on the heat-receiving-side of the radiator plate. Accordingly, the dispersant can comprise a variety of ceramic fibers. However, as set forth above, the dispersant can preferably be composed of primary crystal silicon particles in view of the thermal expansion coefficient, thermal resistance, and so on. Moreover, the primary crystal silicon particles can comprise a silicon simple substance, or can be compounds, and the like, which are composed of the metallic matrix (e.g., aluminum, alloy components, etc.) and silicon.

(3) Filtering Member

The filtering member accumulates the primary crystal thereon but passes the other molten alloy therethrough.

Consequently, depending on the sizes of the primary crystal to be accumulated, the filtering member can be selected from a variety of filtering members having a desired pore diameter.

Specifically, the filtering member is a member, which is formed so as to conform to a configuration of a cavity in a mold by using fibers, whiskers, or the like, being composed of silicon carbide, carbon, alumina, alumina-silica, glass, and so on. Further, the filtering member can preferably have such a strength that it does not disintegrate when the hypereutectic molten alloy is pressurized and charged into the cavity. Furthermore, the filtering member can preferably be such a material that it hardly reacts with the hypereutectic molten alloy, or that it hardly forms new compounds with the hypereutectic molten alloy. Therefore, the filtering member can be selected while taking the compatibility with the hypereutectic molten alloy into consideration. For instance, in a case where the hypereutectic molten alloy is an aluminum-silicon alloy whose hypereutectic component is silicon, it is preferable to use a filtering member, which is made from alumina-silica.

(4) Others

When the present radiator plate is provided with a fin, or the like, on the heat-radiating surface, it is possible to achieve the enlargement of the heat-radiating area so that the present radiator plate can be enhanced in terms of the heat-radiating ability. Further, it is not necessary to cast the present radiator plate for each of final products. The present radiator plate can be cast for a plurality of final products at once. Then, the present radiator plate can be cut and divided to a size of the respective final products.

Furthermore, when the hypereutectic molten alloy is pressurized in the pressurizing-and-charging step, the hypereutectic molten alloy can be pressurized to such a magnitude that the hypereutectic molten alloy impregnates into and penetrates through the filtering member. Thus, it is possible to employ an injection molding process, a die casting process, and so on. Moreover, the temperature of the hypereutectic molten alloy can be adjusted by heating or thermally insulating a plunger, a mold, or the like.

EXAMPLES

The present invention will be hereinafter described more specifically with reference to examples of the radiator plate and manufacturing process therefor according to the present invention.

Radiator Plate

Figure 2:
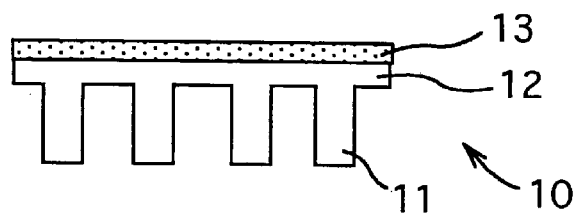
FIG. 2 is a cross-sectional side view for illustrating a radiator plate, an example according to the present invention.

A radiator plate 10, one of the examples according to present invention, is illustrated in FIG. 2.

The radiator plate 10 comprises a heat-radiating portion 11 and a heat-receiving portion 12. The heat-radiating portion 11 has short fins, which are disposed on the heat-radiating side. The heat-receiving portion 12 is disposed on the heat-receiving side. It is manufactured from a molten aluminum (Al)-silicon (Si) alloy by a manufacturing process described later. For example, the molten Al—Si alloy is the A390 alloy, whose silicon content is 17% by mass, as per the standard of the ASTM (American Society for Testing and Materials).

The heat-receiving portion 12 has an accumulated Si layer 13, in which silicon primary particles are accumulated primarily. For instance, the accumulated Si layer 13 included Si in an amount of 30% by mass in the outermost surface when the entirety was taken as 100% by mass. The Si content changed gradually to that of the Al—Si alloy matrix, which included Si in an amount of 17% by mass approximately, from the uppermost surface to the lowermost surface (i.e., from the heat-receiving surface to the heat-radiating surface) in this order.

Manufacturing Process for Radiator Plate

Hereinafter, a process for manufacturing the radiator plate 10 will be described with reference to FIG. 1. FIG. 1 schematically illustrates an outline of a die casting machine 100, which was used to manufacture the radiator plate 10. FIG. 2 illustrates the resulting radiator plate 10.

The die casting machine 100 was equipped with an upper die (not shown) and a lower die 110, two of which served a die as a whole. In a cavity of the die, a filtering member 120 was disposed which conformed to a configuration of the cavity. Note that the filtering member 120 was produced by pressurizing and molding whiskers, which were made from alumina-silica.

Thereafter, the aforementioned molten Al—Si alloy was pressurized and charged by a plunger from the side of the lower die 110 (i.e., the pressurizing-and-charging step). At this moment, the temperature of the lower die 110 was adjusted to and maintained at such a temperature that the Si primary crystal particles arose in the molten Al—Si alloy.

Moreover, in the pressurizing-and-charging step, the charging pressure was controlled to such a pressure that the molten Al—Si alloy, which was free from the primary crystal particles having a predetermined particle diameter or more, penetrated through the filtering member 120 without destroying the filtering member 120. For instance, the charging pressure fell in a range from dozens of MPa to 100 MPa.

Then, while leaving the filtering member 120 in the cavity, the die was cooled, thereby solidifying the molten Al—Si alloy (i.e., the solidifying step). After detaching the molded product from the die, the filtering member 120 was removed by machining (i.e., the removing step). Note that, at this moment, it is possible to efficiently manufacture the radiator plate 10 by carrying out finishing the heat-receiving surface of the radiator plate 10, simultaneously with carrying out the removing step.

Others

Figure 3:
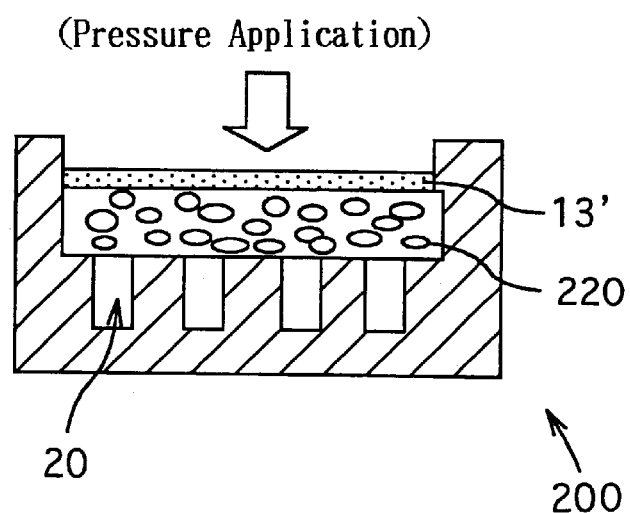
FIG. 3 is a schematic diagram for illustrating a process for manufacturing a radiator plate, another example according to the present invention.

FIG. 3 illustrates another process for manufacturing a radiator plate 20 according to the present invention. Note that, in a die casting machine 200 illustrated in FIG. 3, a pouring direction of a molten Al—Si alloy differs from that of the above-described example. Namely, the molten Al—Si alloy was pressurized and charged from the heat-receiving-surface side of the radiator plate 20 (i.e., from the side of a not-shown upper die), thereby forming an accumulated Si layer 13' on an upper-surface side of a filtering member 220. In this case, it was not necessary to remove the filtering member 220, because the accumulated Si layer 13' had been already formed on the heat-receiving-surface side. Note that, in order to secure a flatness of the heat-receiving surface, the finish processing can be carried out onto the accumulated Si layer 13'.

Moreover, since Si primary particles, which had a predetermined particle diameter or more (e.g., from 20 to 100 μm), were filtered out, the heat-radiating portion of the radiator plate 20 comprised an Al—Si alloy, from which the Si primary crystal particles having a predetermined particle diameter or more were removed. Moreover, the Si—Al alloy was fine and uniform, and included Si primary crystal particles, which had passed through the filtering member 220 and which had a particle diameter of a couple of μm or less.

The thus obtained radiator plates 20 were warped less, and were good in terms of the dimensional stability as a final product. Further, they were good in terms of the heat radiating ability. Furthermore, by employing the manufacturing process according to the present invention, such radiator plates could be manufactured with ease as well as with a high productivity.

In the above-described examples, the radiator plates were exemplified in which the fins existed on the heat-radiating-surface side. Note that, however, it is needless to say that the present invention can be applied to a simple plate-shaped radiator, which is free from the fins.

Such a plate-shaped radiator can be used in a case, for example, where heat is released by adhering a heat-radiating surface of a power module onto a heat sink or a box of instruments, and so on.

Having now fully described the present invention, it will be apparent to one of ordinary skill in the art that many changes and modifications can be made thereto without departing from the spirit or scope of the present invention as set forth herein including the appended claims.

What is claimed is:

1. A radiator plate, comprising:
    a metallic matrix exhibiting a predetermined coefficient of thermal expansion; and
    a dispersant being dispersed in said metallic matrix and exhibiting a coefficient of thermal expansion being smaller than that of said metallic matrix;
    said radiator plate having a heat-receiving surface, and a heat-radiating surface for radiating heat received from the heat-receiving surface;
    said dispersant comprising a primary crystal crystallized from a hypereutectic molten alloy and being dispersed more on a side of said heat-receiving surface than on a side of said heat-radiating surface.

2. The radiator plate according to claim 1, wherein said metallic matrix is at least one member selected from the group consisting of pure metals and alloys thereof.

3. The radiator plate according to claim 2, wherein the pure metal is at least one member selected from the group consisting of aluminum, magnesium, copper and zinc.

4. The radiator plate according to claim 1, where said hypereutectic molten alloy is a molten aluminum-silicon alloy whose hypereutectic component is silicon.

5. The radiator plate according to claim 4, wherein said dispersant is composed of primary crystal silicon particles.

6. The radiator plate according to claim 5, wherein said primary crystal silicon particles comprise at least one member selected from the group consisting of a silicon simple substance and compounds being composed of said metallic matrix and silicon.

7. The radiator plate according to claim 4, where said metallic matrix comprises aluminum as a major component.

* * * * *